(12) United States Patent
Grolle et al.

(10) Patent No.: US 11,991,869 B2
(45) Date of Patent: May 21, 2024

(54) THERMAL MANAGEMENT SYSTEM INCLUDING AN OVERMOLDED LAYER AND A CONDUCTIVE LAYER OVER A CIRCUIT BOARD

(71) Applicant: Lunar Energy, Inc., Mountain View, CA (US)

(72) Inventors: Steven Nicholas Grolle, Mountain View, CA (US); Gargi Kailkhura, San Jose, CA (US); Peter H. J. How, Honolulu, HI (US); Charles Ingalz, San Jose, CA (US); Andrew Diao, Santa Cruz, CA (US); Stephen Robert Bannick, San Francisco, CA (US)

(73) Assignee: Lunar Energy, Inc., Mountain View, CA (US)

( * ) Notice: Subject to any disclaimer, the term of this patent is extended or adjusted under 35 U.S.C. 154(b) by 0 days.

(21) Appl. No.: 18/484,287

(22) Filed: Oct. 10, 2023

(65) Prior Publication Data

US 2024/0121923 A1 Apr. 11, 2024

Related U.S. Application Data

(60) Provisional application No. 63/415,139, filed on Oct. 11, 2022.

(51) Int. Cl.
*H05K 7/20* (2006.01)
*H05K 1/02* (2006.01)

(52) U.S. Cl.
CPC ........... *H05K 7/209* (2013.01); *H05K 1/0203* (2013.01); *H05K 7/20454* (2013.01); *H05K 7/20509* (2013.01)

(58) Field of Classification Search
CPC .......... H05K 7/20463; H05K 7/20509; H05K 7/209; H05K 7/20454; H05K 1/0203
See application file for complete search history.

(56) References Cited

U.S. PATENT DOCUMENTS

| | | | |
|---|---|---|---|
| 8,488,324 B2* | 7/2013 | Becker | H05K 7/20463 257/713 |
| 10,342,167 B2* | 7/2019 | Bouwkamp | B60R 1/088 |
| 10,785,871 B1* | 9/2020 | Vinciarelli | H05K 1/116 |
| 2006/0281230 A1* | 12/2006 | Brandenburg | H01L 23/3121 257/E21.705 |
| 2011/0292624 A1* | 12/2011 | Tanaka | H05K 5/0052 361/752 |

\* cited by examiner

*Primary Examiner* — Zachary Pape
(74) *Attorney, Agent, or Firm* — Van Pelt, Yi & James LLP

(57) ABSTRACT

A system is including: an overmolded layer that is placed above a top surface and below a bottom surface of a circuit board, wherein the overmolded layer exposes at least communication interfaces on the circuit board and surrounds a heat generating component on the circuit board; a conductive layer that is placed over the overmolded layer on the top surface of the circuit board, wherein the conductive layer exposes the communication interfaces of the circuit board and covers the heat generating component on the circuit board; and wherein heat from the heat generating component is transferred into the conductive layer.

13 Claims, 10 Drawing Sheets

THERMAL MANAGEMENT SYSTEM INCLUDING AN OVERMOLDED LAYER AND A CONDUCTIVE LAYER OVER A CIRCUIT BOARD

CROSS REFERENCE TO OTHER APPLICATIONS

This application claims priority to U.S. Provisional Patent Application No. 63/415,139 entitled SANDWICH THERMAL MANAGEMENT SYSTEM filed Oct. 11, 2022, which is incorporated herein by reference for all purposes.

BACKGROUND OF THE INVENTION

Electrical devices include components that generate considerable heat. However, too much heat could create safety concerns as well as degrade the performance of certain components within the electronic device. It would be desirable to manage the heat generated by certain electrical components within an electrical device while maintaining electrical insulation to prevent any unwanted current flow.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Embodiments of a thermal management system are described herein. An insulating overmolded layer is placed above a top surface and below a bottom surface of a circuit board. The overmolded layer exposes at least communication interfaces on the circuit board and surrounds a heat generating component on the circuit board. For example, the heat generating component is a central processing unit (CPU). A conductive layer is placed over the overmolded layer on the top surface of the circuit board. The conductive layer exposes the communication interfaces of the circuit board and covers the heat generating component on the circuit board. The heat from the heat generating component is transferred into the conductive layer.

Figure 1:
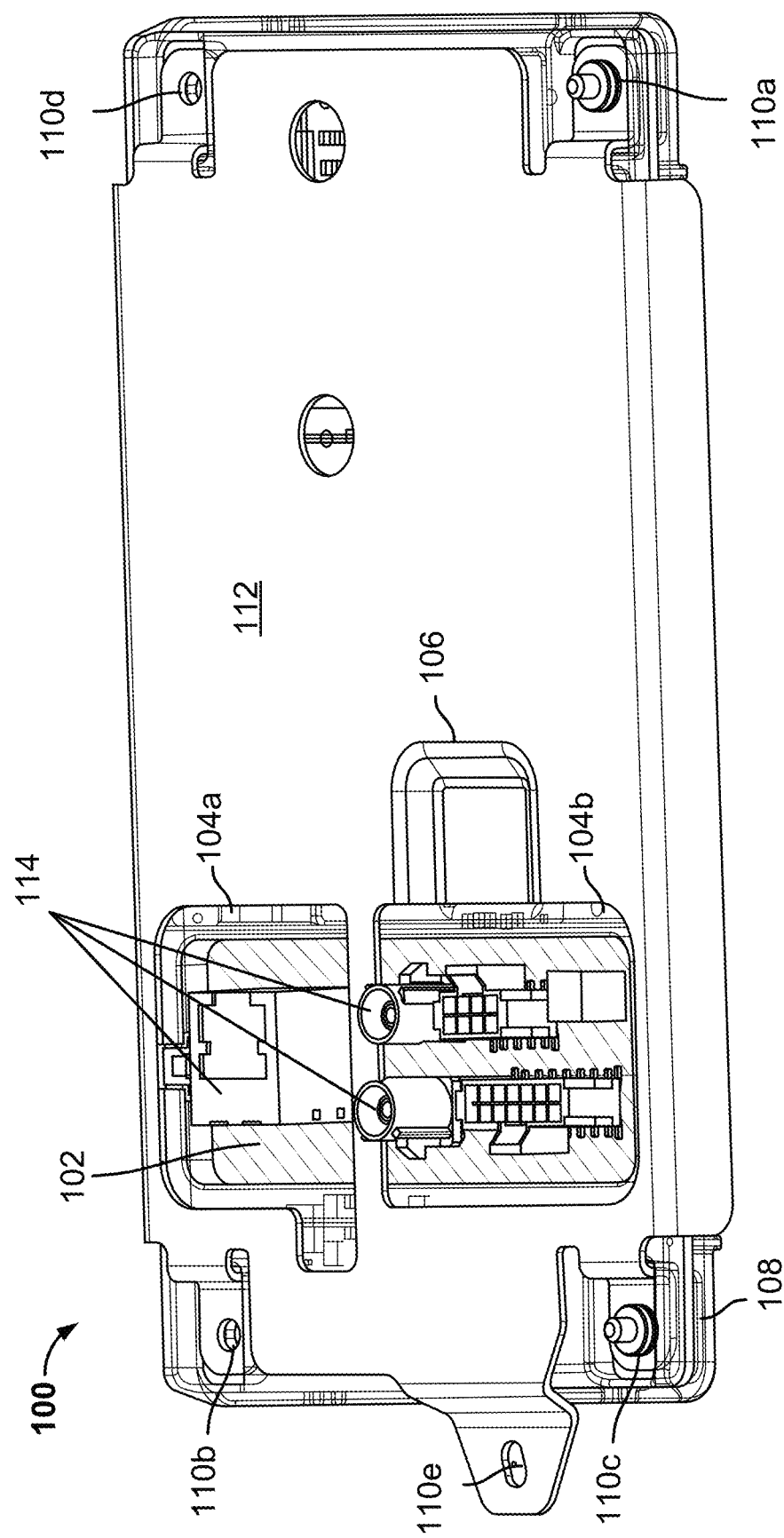
FIG. 1 is a diagram showing an embodiment of a home controller module with a thermal management system.

FIG. 1 is a diagram showing an embodiment of a home controller module with a thermal management system. In FIG. 1, home controller 100 is a module that can be placed on the interior of an inverter device (not shown). In FIG. 1, home controller 100 is shown in an orientation that may be inverted from the position in which it may be mounted inside the inverter device. The inverter device also includes a power module that is configured to, among other functions, perform the conversion of input direct current (DC) (e.g., which is generated by photovoltaic cells) to output alternating current (AC). In the context of the inverter device, home controller 100 includes circuit board 102 (for which regions that are exposed are shown in a striped pattern in FIG. 1) with components that are configured to communicate to one or more battery modules and also with a user. As will be described in further detail below, home controller 100 can be mounted/attached to the interior of an inverter device at mounting points 110a, 110b, 110c, 110d, and 110e. In FIG. 1, mounting points 110c and 110a each includes a respective fastener while mounting points 110e, 110b, and 110d do not (yet) include fasteners. One advantage to having home controller 100 be separable (attachable and detachable) from the inverter device is that home controller 100 can be easily swapped out for repair or in the event if a component (e.g., a cellular data transmission module) thereof needs to be changed (e.g., to be upgraded to a newer standard) without affecting the other components within the inverter device.

Home controller 100 includes circuit board 102, which is substantially encapsulated in overmolded layer 108. In various embodiments, overmolded layer 108 is made of an insulating material (e.g., plastic). Overmolded layer 108 covers the entire perimeter of circuit board 102. Overmolded layer 108 covers the regions on the top surface of circuit board 102 other than exposed areas 104a and 104b that expose communication interfaces (such as interfaces 114) of circuit board 102. In some embodiments, exposed areas 104a and 104b form one continuous exposed region in overmolded layer 108. Overmolded layer 108 also exposes the areas on circuit board 102 that are proximate to and include mounting points 110a, 110b, 110c, and 110d. While not visible in FIG. 1, overmolded layer 108 also exposes the top surface of a heat generating component (e.g., a CPU) that is mounted to the top surface of circuit board 102. As shown in FIG. 1, mounting points 110a, 110b, 110c, and 110d are not covered by overmolded layer 108 and include through-holes directly through circuit board 102. In some embodiments, the through-holes through circuit board 102 at mounting points 110a, 110b, 110c, and 110d are plated with protective coating (e.g., copper or tin) to provide ingress protection to circuit board 102. Overmolded layer 108 also covers the regions on the bottom surface (not shown) of circuit board 102 other than the areas proximate to and including mounting points 110a, 110b, 110c, and 110d. By selectively exposing the communications interfaces of circuit board 102 to the interior of the inverter device, overmolded layer 108 allows the interfaces to be connected to other components within the inverter device while also providing ingress seals/protection of the covered electrical components of circuit board 102.

Conductive layer 112 comprises a sheet of conductive material (e.g., metal such as aluminum) that substantially covers the portion of overmolded layer 108 that covers the top surface of circuit board 102. Given that conductive layer 112 is thermally conductive, it acts as a heat sink to the components of circuit board 102. In particular, conductive layer 112 includes recessed area 106 that corresponds to/covers the location/top surface/area of the exposed heat generating component (e.g., a CPU), which generates comparatively more heat than other components on circuit board 102, to provide greater thermal connectivity with and therefore draw away more heat from that component. As will be described in further detail below, the bottom surface of recessed area 106 is flush against a thermal interface that has been applied to the top surface of the heat generating component to lower the thermal impedance between that heating generating component and conductive layer 112. Conductive layer 112 also includes cutout regions that correspond to exposed regions 104a and 104b of overmolded layer 108 to expose the communication interfaces (such as interfaces 114) of circuit board 102 (e.g., to the interior of the inverter device). Conductive layer 112 includes tabs with through-holes that correspond/match with the through-holes of circuit board 102 at mounting points 110a, 110b, 110c, and 110d so that conductive layer 112 can be fastened to circuit board 102. Conductive layer 112 also includes a tab with a through-hole at mounting point 110e (that extends beyond overmolded layer 108) to enable home controller 100 to be directly mounted to the interior of the inverter device. As will be shown in further detail below, home controller 100 can be mounted to the interior of the inverter device with fasteners that go through conductive layer 112, circuit board 102, and a conductive liner of the inverter device at mounting points 110a, 110b, 110c, and 110d and a fastener that goes through conductive layer 112 and the conductive liner of the inverter device at mounting point 110e.

In addition to acting as a heat sink, conductive layer 112 also provides ElectroMagnetic Compatibility (EMC), which protects circuit board 102 from external electromagnetic signals within the inverter device and prevents a stronger signal from leaking out from circuit board 102 and interfering with surrounding electronics within the inverter device. Because EMC improves inversely proportionally to the size of apertures, the total area of exposed communication interfaces of circuit board 102 is divided into multiple cutout regions (i.e., separate cutout regions to correspond to 104a and 104b) to decrease the size/area of each cutout/aperture. Furthermore, because EMC improves with shorter distances between connections to a grounding point, conductive layer 112 includes several mounting points 110a, 110b, 110c, 110d, and 110e, each of which is attached to ground (e.g., a point on a conductive liner within the inverter device that is electrically bonded to a grounding element).

While not shown in FIG. 1, in some other embodiments, in addition to conductive layer 112 that covers the top surface of home controller 100, there is another, separate conductive layer that covers the bottom surface of home controller 100. The additional conductive layer that could cover the bottom surface of home controller 100 would serve as another heat sink for the components on circuit board 102 and improve EMC for home controller 100.

Figure 2:
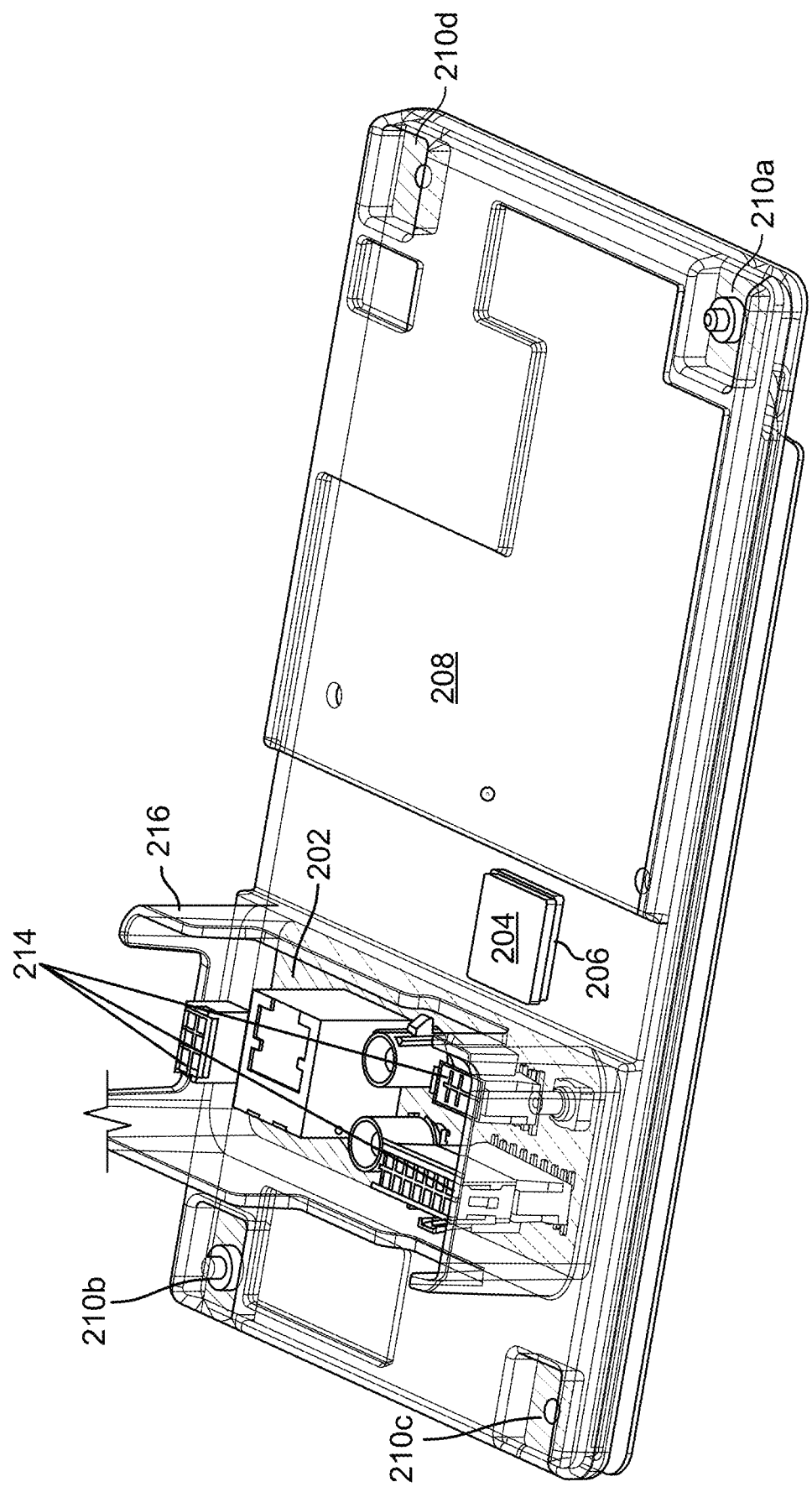
FIG. 2 is a diagram of a closeup image of the top surface of an example home controller, in accordance with some embodiments, with the conductive layer omitted.

FIG. 2 is a diagram of a closeup image of the top surface of an example home controller, in accordance with some embodiments, with the conductive layer omitted. In some embodiments, the uncovered top surface of home controller 100 of FIG. 1 is shown in FIG. 2. To better show what is underneath the exterior conductive layer over the top surface of the home controller (e.g., home controller 100 of FIG. 1), FIG. 2 shows the top surface of the home controller with this conductive layer omitted. As shown in FIG. 2, the home controller includes circuit board 202 being substantially covered by overmolded layer 208 but for some selected regions of the circuit board. The regions of the top surface of circuit board 202 that are exposed (not covered by overmolded layer 208) are shown in a striped pattern in FIG. 2. Overmolded layer 208 can be made by applying low pressure overmold material (e.g., plastic) over the top and bottom surfaces of circuit board 202. Overmolded layer 208 can provide a strong seal (e.g., against dust and/or moisture) to the circuit board components within. In particular, circuit board 202 is made of materials such as fiberglass and/or thermoplastics and its edges (perimeter) are typically not covered in protective coating unlike its top and bottom surfaces, which are typically covered with protective coating. Put another way, the edges/perimeter of circuit board 202 may be vulnerable to moisture or other contaminants. However, overmolded layer 208 fully covers the edges/perimeter of circuit board 202, which provides ingress protection for the edges/perimeter.

As shown in FIG. 2, while overmolded layer 208 substantively covers the top surface of circuit board 202 to protect sensitive electronics from the internal environment of an inverter device, overmolded layer 208 does selectively expose (not cover) certain regions of circuit board 202. As shown in FIG. 2, the regions of circuit board 202 that are exposed out of overmolded layer 208 include the areas on circuit board 202 that surround mounting points 210a, 210b, 210c, and 210d, communications interfaces (e.g., such as interfaces 214), and heat generating component 206. For example, communication interfaces 214 include a connection to an antenna pass through module, coaxial cable connections, and an ethernet connection. For example, heat generating component 206 comprises a CPU package. In various embodiments, the bottom surface of heat generating component 206 is mounted to circuit board 202 and overmolded layer 208 surrounds the edges/perimeter of heat generating component 206 such that only the top surface of heat generating component 206 is exposed through overmolded layer 208. Heat generating component 206 generates considerable heat (e.g., 2 Watts) when the circuit to which it is attached is in operation. Therefore, it is desirable to transfer heat away from heat generating component 206 such that heat generating component 206 can stay operating at a desirable temperature. To lower the thermal impedance between heat generating component 206 and the conductive layer (e.g., conductive layer 112 of FIG. 1) that is to substantially cover the top surface of circuit board 202, compressible thermal interface pad 204 (e.g., a thermal gap pad) can be added to the top surface (which is shown in FIG. 2) of heat generating component 206 before the conductive layer is added. A depression/recessed area (e.g., recessed area 106 of FIG. 1) in the conductive layer (not shown) can be placed over compressible thermal interface pad 204 to further lower the thermal impedance between heat generating component 206 and the heat sink/conductive layer. Put another way, compressible thermal interface pad 204, which is attached to the top surface of heat generating component 206, can compress to reduce the distance and also act to reduce the thermal impedance (e.g., reduce the air gap) between the top surface of heat generating component 206 and the conductive layer, to thereby improve heat transfer from heat generating component 206 to the conductive layer.

While not shown in the example of FIG. 1, in the example of FIG. 2, overmolded layer 208 includes a protruding housing, housing 216, that surrounds the communication interfaces (e.g., including communication interfaces 214).

Figure 3:
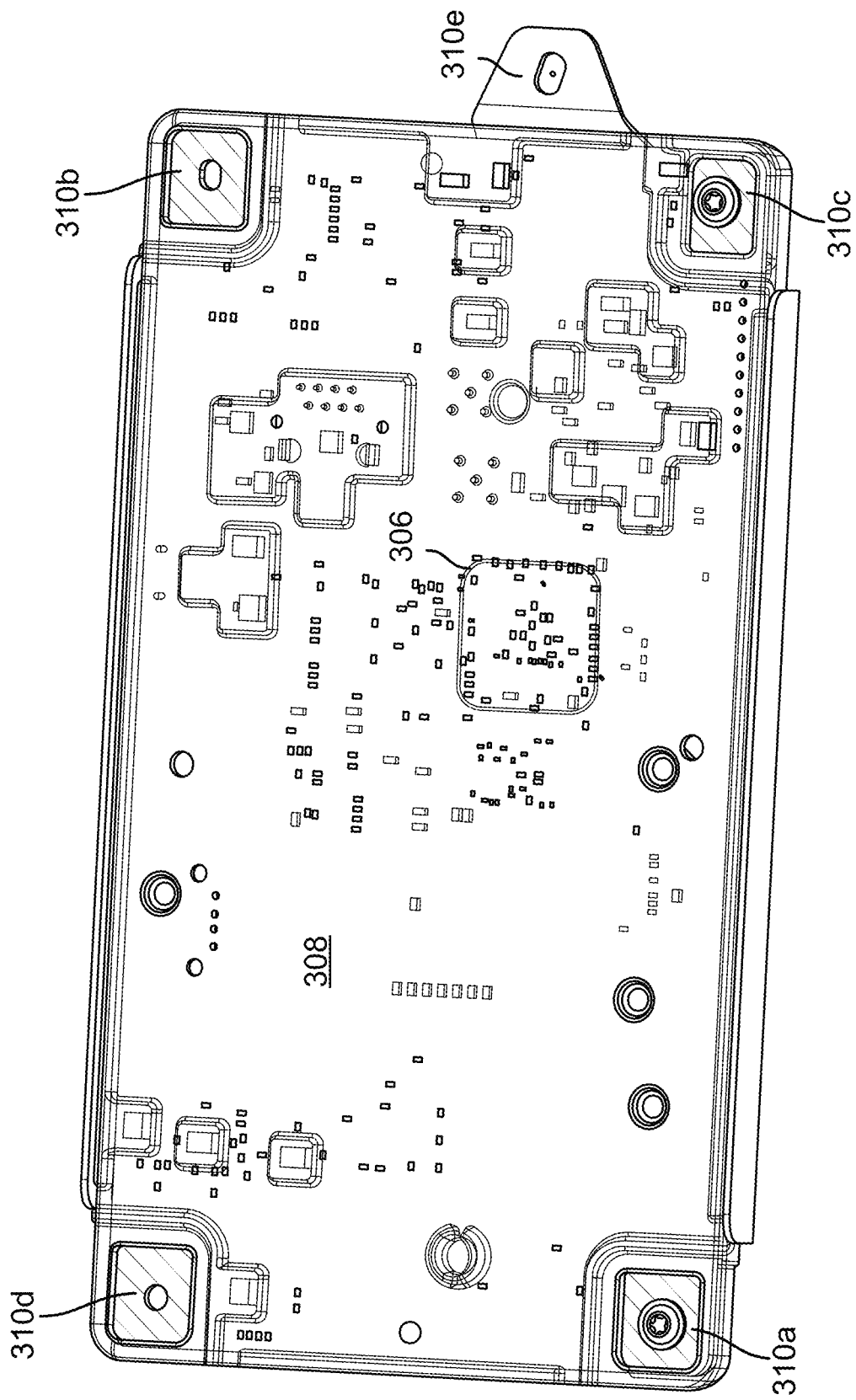
FIG. 3 is a diagram of a closeup image of the bottom surface of an example home controller in accordance with some embodiments.

FIG. 3 is a diagram of a closeup image of the bottom surface of an example home controller in accordance with some embodiments. In some embodiments, the bottom surface of home controller 100 of FIG. 1 is shown in FIG. 3. Overmolded layer 308 substantially covers the bottom surface of the circuit board. The only portions of the bottom surface of the circuit board that are not encapsulated by overmolded layer 308 are the exposed areas (shown in a striped pattern) that include through-holes in the circuit board at mounting points 310a, 310b, 310c, and 310d. As mentioned above, mounting point 310e, which includes a through-hole in the conductive layer that covers the top surface of the circuit board, can be used along with mounting points 310a, 310b, 310c, and 310d to mount the home controller to the interior of an inverter device (not shown). Overmolded layer 308 includes depression 306 on the bottom surface of the home controller under the area of the circuit board in which the heat generating component (e.g., heat generating component 206 of FIG. 2) (not shown in FIG. 3) is located on the other side (the top surface) of the home controller. Depression 306 does not expose the enclosed circuit board but rather is a comparatively thinner area of the overmold material relative to the thickness of the material in the immediate vicinity.

In some embodiments but not shown in FIG. 3, another compressible thermal interface pad can be placed in depression 306 on the bottom surface of the home controller. As mentioned above, the heat generating component (that is surrounded by the overmolded layer on the top surface of the home controller) can be a CPU, which produces a significant amount of heat. In some embodiments, a second, conductive layer (not shown) can then be added over the portion of overmolded layer 308 that is located over the bottom surface of the circuit board. A depression in the bottom surface conductive layer can be placed over the compressible thermal interface pad (e.g., a compressible thermal gap pad). The compressible thermal interface pad, which is thermally conductive, on the area of the circuit board that is beneath the heat generating component can act to reduce the thermal impedance (e.g., reduce the air gap) between the heat generating component and the bottom conductive layer and thereby improve heat transfer from the bottom surface of the heat generating component to the bottom surface conductive layer.

Figure 4:
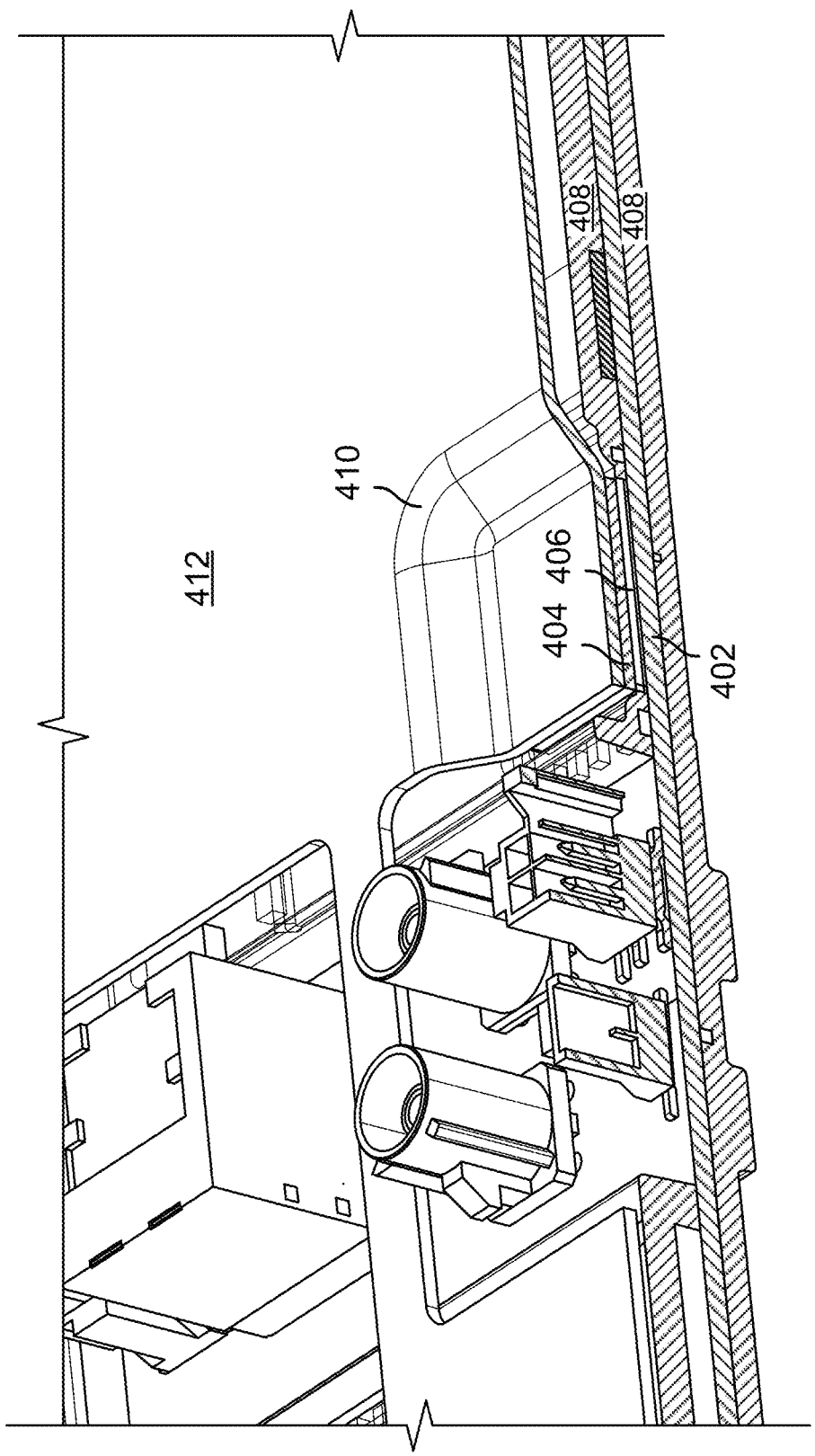
FIG. 4 is a diagram showing a cross-section of an example of a home controller in accordance with some embodiments.

FIG. 4 is a diagram showing a cross-section of an example of a home controller in accordance with some embodiments. In some embodiments, the cross-section of home controller 100 of FIG. 1 is shown in FIG. 4. In FIG. 4, the cross-section cuts through recessed area 410 of conductive layer 412 on the top surface of the home controller. In the cross-section shown in FIG. 4, recessed area 410 of conductive layer 412 is layered over a thermal interface material, compressible thermal interface pad 404, which is directly attached to the top surface of heat generating component 406. Compressible thermal interface pad 404 is made of material (e.g., silicone polymer and/or ceramic) that is thermally conductive but electrically insulating. Heat generating component 406 is mounted to the top surface of circuit board 402 and surrounded by overmolded layer 408. As shown in FIG. 4, while conductive layer 412 provides clearance (e.g., an air gap) over other covered areas of overmolded layer 408 on the top surface of circuit board 402, conductive layer 412 is pressed substantially flush against compressible thermal interface pad 404, which is attached to heat generating component 406. As such, by minimizing the presence of air gaps (which increase thermal impedance), compressible thermal interface pad 404 provides improved heat transfer from heat generating component 406 to conductive layer 412 but also electrical insulation between the two items. The cross-section of FIG. 4 also shows that circuit board 402 is covered on its top and bottom surfaces by overmolded layer 408.

Figure 5:
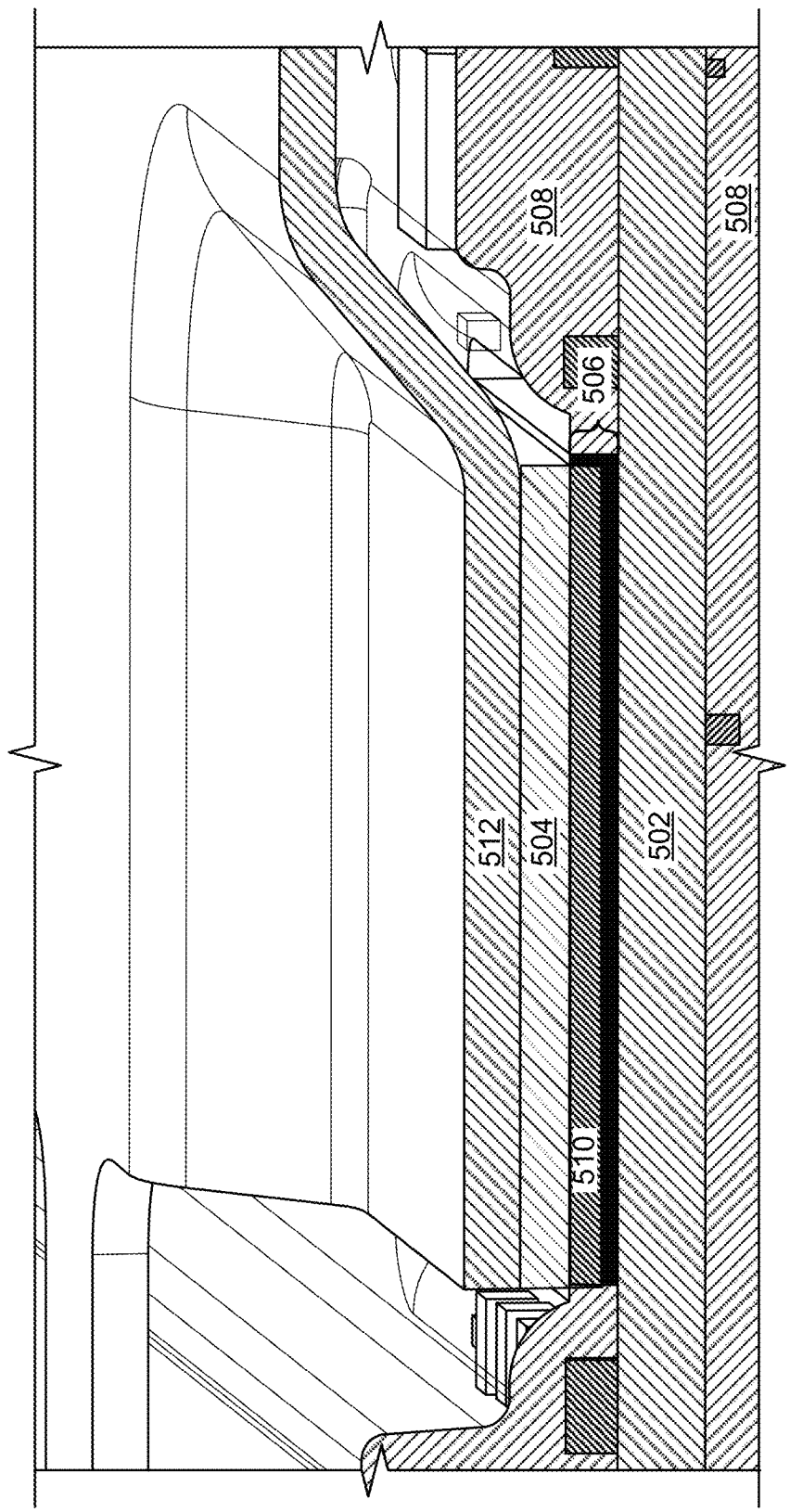
FIG. 5 is a diagram showing a close-up of a cross-section of an example of a home controller in accordance with some embodiments.

FIG. 5 is a diagram showing a close-up of a cross-section of an example of a home controller in accordance with some embodiments. In some embodiments, the cross-section of home controller 100 of FIG. 1 is shown in FIG. 5. In some embodiments, the cross-section that is shown in FIG. 5 is a close-up of the cross-section that is shown in FIG. 4. In FIG. 5, a recessed area of conductive layer 512 is flush against the top surface of compressible thermal interface pad 504. Compressible thermal interface pad 504 is in turn attached to the top surface of heat generating component 506. In some embodiments, heat generating component 506 comprises a CPU package, which is mounted onto and part of the circuit that is printed on the top surface of circuit board 502. The perimeter of heat generating component 506 is surrounded by overmolded layer 508, which provides ingress protection to the perimeter and also bottom surface of heat generating component 506. For example, the top surface of heat generating component 506 is substantially flush with the surface of overmolded layer 508 that is in the vicinity. In the assembly of the home controller, conductive layer 512 is added over the top surface of overmolded layer 508 and then fastened to circuit board 502 via (e.g., four) mounting points. As conductive layer 512 is fastened to circuit board 502, compressible thermal interface pad 504 compresses against the top surface of heat generating component 506, which is represented by overlap 510 that is shown FIG. 5, even though compressible thermal interface pad 504 does not actually physically overlap with heat generating component 506. The cross-section of FIG. 5 also shows that circuit board 502 is covered on its top and bottom surfaces by overmolded layer 508.

Figure 6:
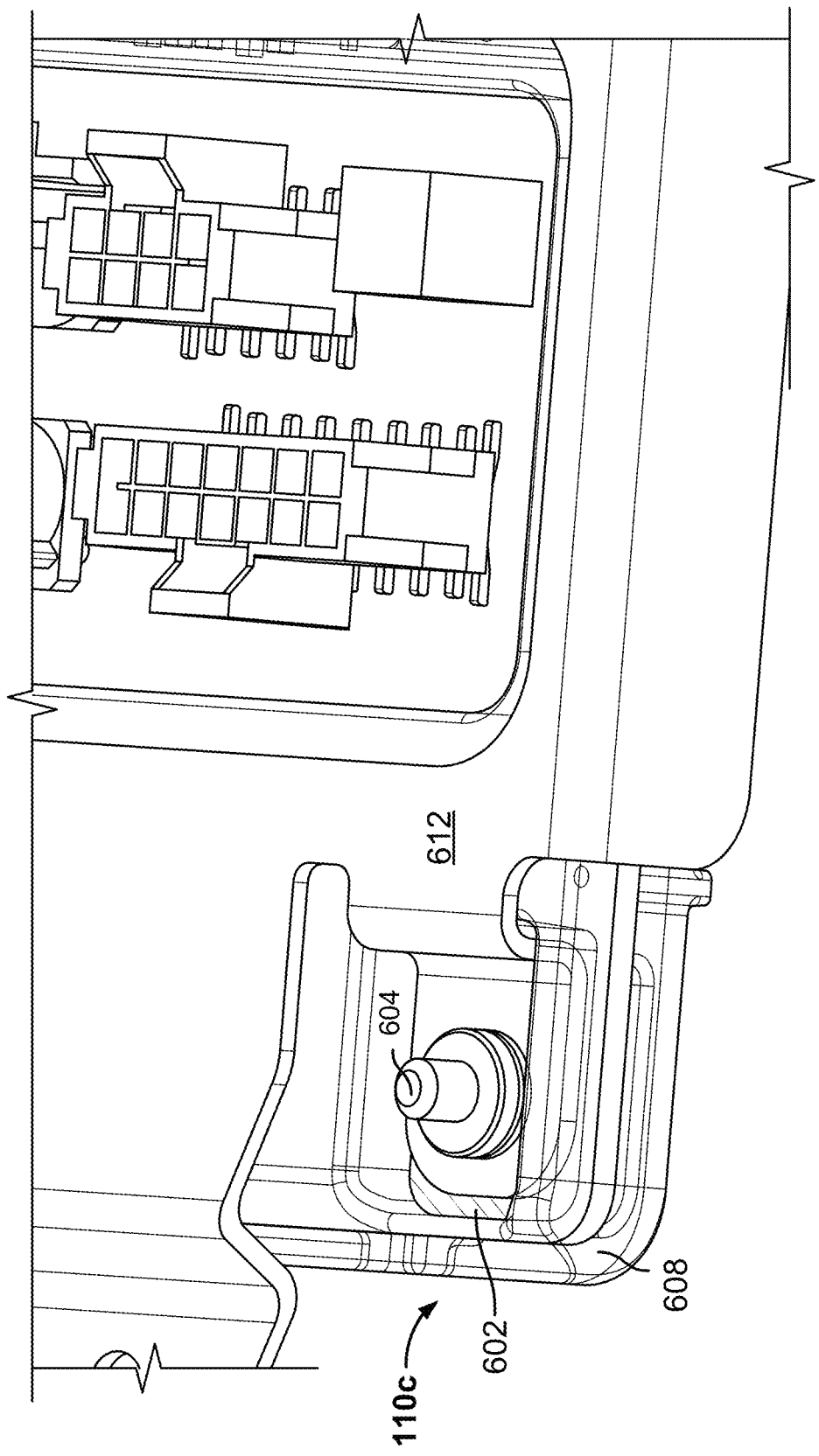
FIG. 6 is a diagram showing a close-up of a mounting point on a home controller in accordance with some embodiments.

FIG. 6 is a diagram showing a close-up of a mounting point on a home controller in accordance with some embodiments. In some embodiments, the mounting point that is shown in FIG. 5 is a close-up of mounting point 110c of home controller 100 of FIG. 1. The other mounting points 110a, 110b, and 110d can be implemented similarly to the example implementation of mounting point 110c in FIG. 6. In FIG. 6, the mounting point is one of the mounting points of the home controller that is located on a corner of circuit board 602 (which is shown in a striped pattern). The mounting point comprises a region on circuit board 602 that is exposed through overmolded layer 608 on the top surface and the bottom surface of circuit board 602 and where this region includes a through-hole. Conductive layer 612 includes a tab with a through-hole that matches the location of the through-hole in circuit board 602. As such, the through-hole in the tab of conductive layer 612 aligns with the through-hole in circuit board 602 such that fastener 604 can be inserted through both conductive layer 612 and circuit board 602 to fasten conductive layer 612 to circuit board 602, and potentially to fasten the home controller to an interior portion of the inverter device (e.g., a conductive sheet that lines an interior wall of the inverter device).

Figure 7:
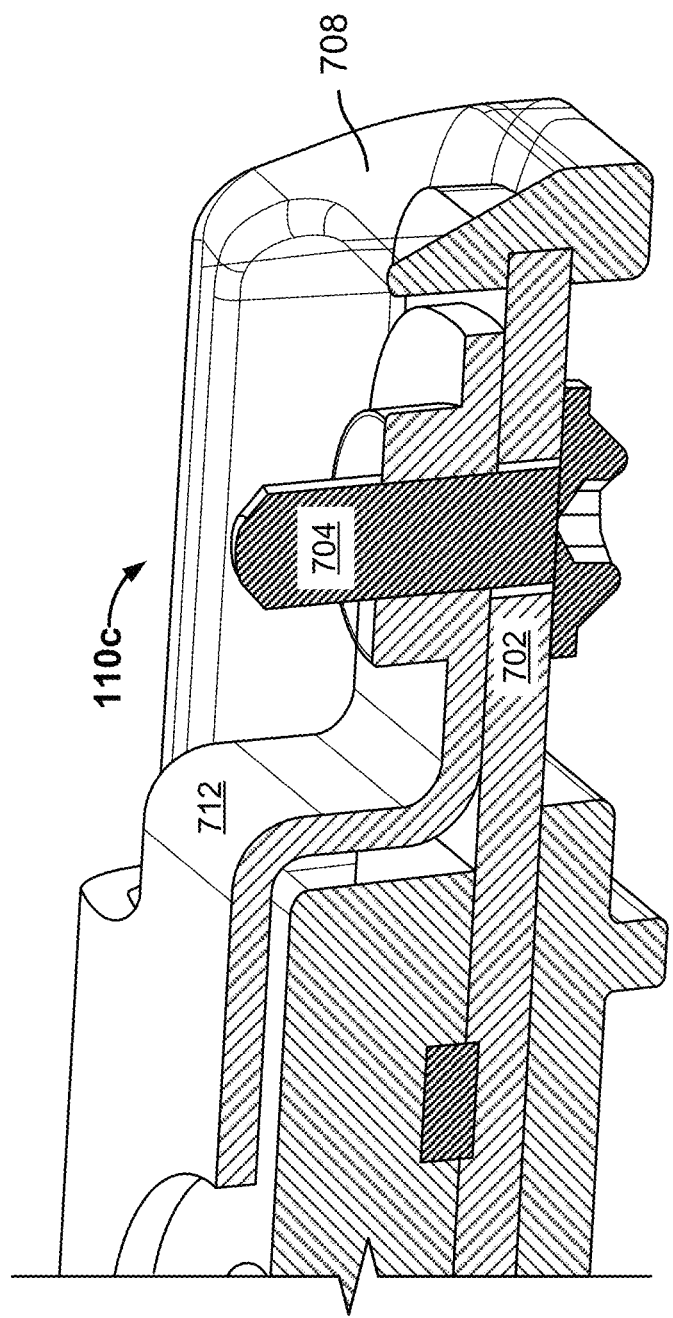
FIG. 7 is a diagram showing a cross-section of a mounting point on a home controller in accordance with some embodiments.

FIG. 7 is a diagram showing a cross-section of a mounting point on a home controller in accordance with some embodiments. In some embodiments, the mounting point that is shown in FIG. 7 is a close-up of mounting point 110c of home controller 100 of FIG. 1. In some embodiments, the cross-section that is shown in FIG. 7 is a close-up of the cross-section that is shown in FIG. 6. As shown in FIG. 7, the cross-section of the mounting point comprises fastener 704 (e.g., comprising a conductive material like metal) that has been inserted (e.g., and engaged) through the through-holes in conductive layer 712 and circuit board 702 of the home controller. FIG. 7 also shows that overmolded layer 708 wraps around the edge/perimeter of circuit board 702 to provide ingress protection for the edge/perimeter.

Figure 8:
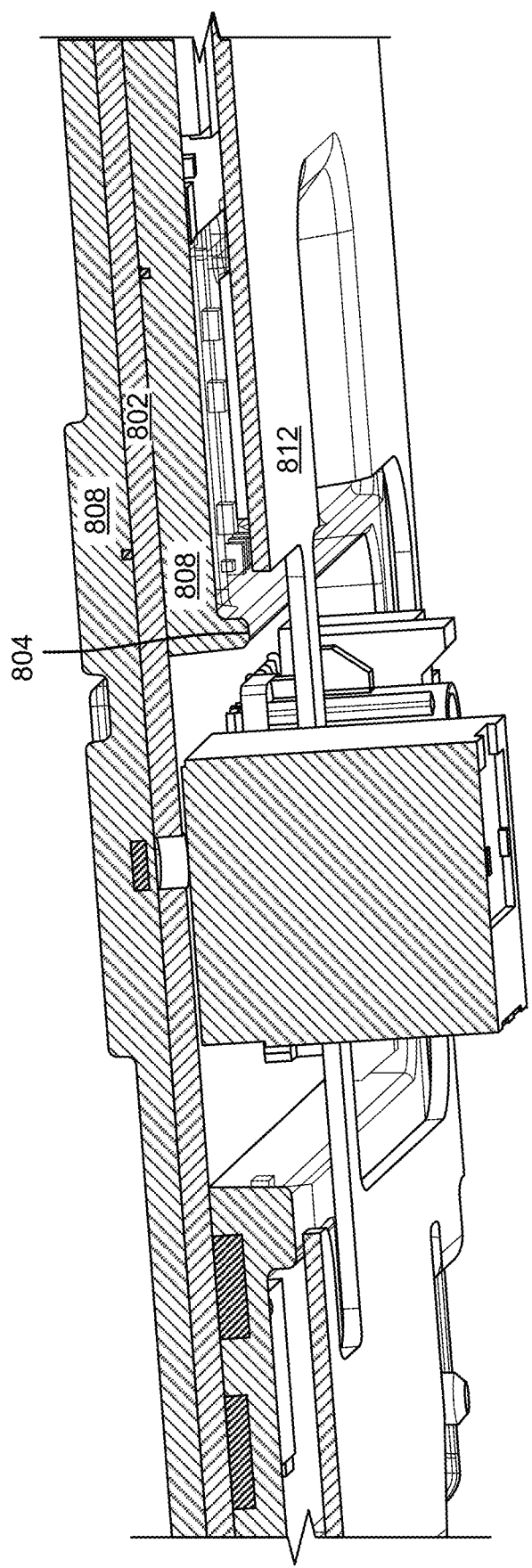
FIG. 8 is a diagram showing a cross-section of the home controller in accordance with some embodiments.

FIG. 8 is a diagram showing a cross-section of the home controller in accordance with some embodiments. In particular, FIG. 8 shows a cross-sectional view of the home controller in an orientation that is inverted from the views shown in FIGS. 1-7. Put another way, in FIG. 8, the home controller is shown upside-down relative to how it is shown in FIGS. 1-7. In some embodiments, the home controller may be mounted to the interior of an inverter device in the inverted or upside-down orientation that is shown in FIG. 8. Overmolded layer 808 on the "top" surface of circuit board 802 is shown to include ridge 804 that protrudes and is exposed out of a cutout region of conductive layer 812 along with the communication interfaces of circuit board 802. The advantage of having a protruding feature such as ridge 804 that is exposed out of overmolded layer 808 and conductive layer 812 is that when the home controller is installed in such an inverted/upside-down orientation as shown in FIG. 8, any condensation that builds on the surface of overmolded layer 808 that covers the "top" surface of the home controller can collect, via gravity, at the ridge 804 and drip out into the internal environment of the inverter device without becoming trapped between overmolded layer 808 and the underside of conductive layer 812. It is desirable to passively remove any moisture between overmolded layer 808 and the underside of conductive layer 812 in this manner because the moisture could damage an electrical component on circuit board 802.

Figure 9:
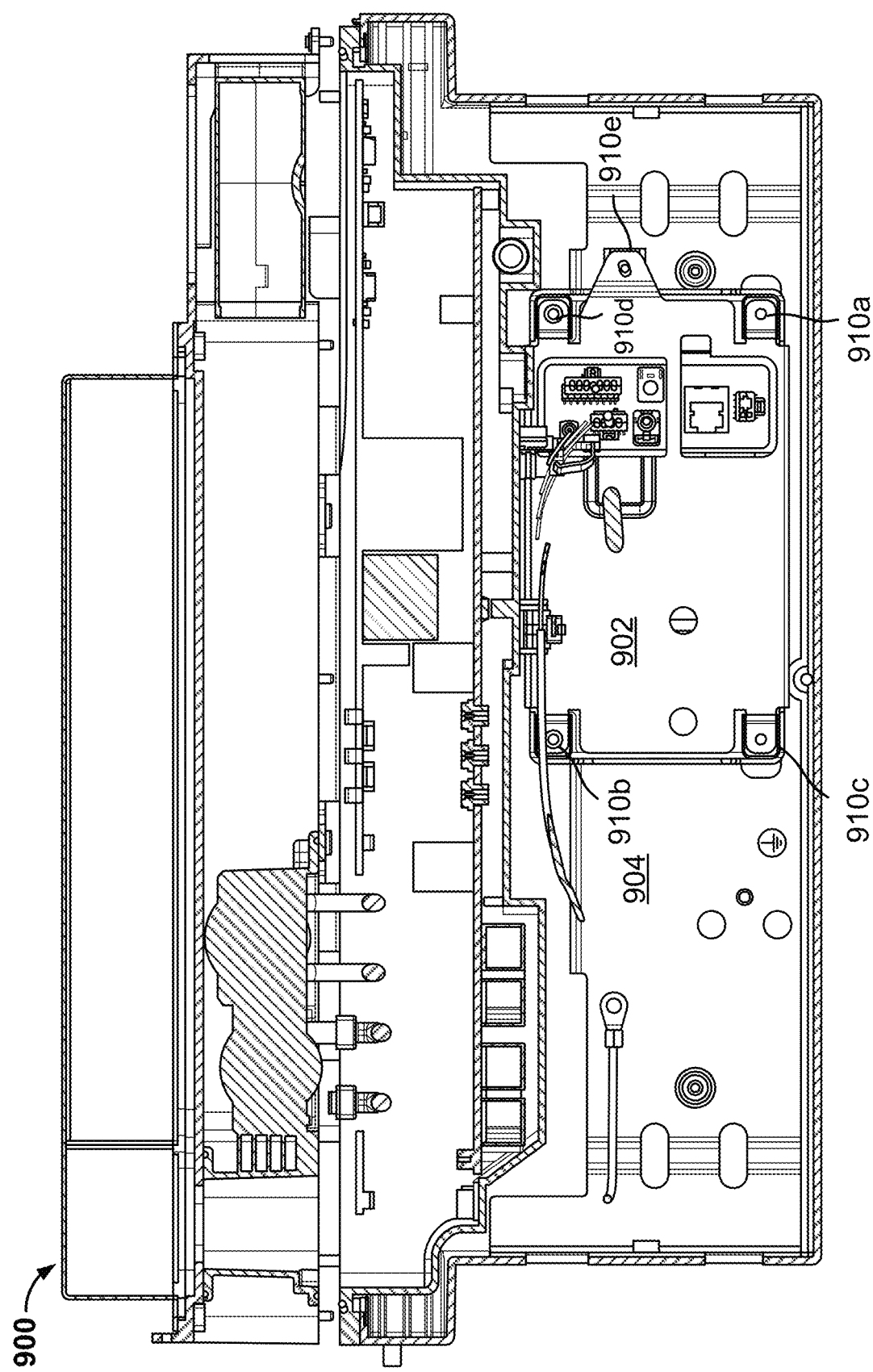
FIG. 9 is a diagram showing a cross-section of the interior of an inverter device in accordance with some embodiments.

FIG. 9 is a diagram showing a cross-section of the interior of an inverter device in accordance with some embodiments. Home controller 902 is located within the insulating enclosure of inverter device 900. In some embodiments, home controller 902 can be implemented using home controller 100 of FIG. 1. The interior side/wall of inverter device 900 to which home controller 902 is mounted includes conductive liner 904. For example, conductive liner 904 comprises an electrically conductive (e.g., metallic) liner that is closer fitted to one or more interior walls within the insulating enclosure of inverter device 900. In various embodiments, conductive liner 904 is electrically bonded to a grounding element (not shown in FIG. 9) and so conductive liner 904 serves as a ground plane to all the components that are connected to it. As shown in FIG. 9, each of mounting points 910a, 910b, 910c, 910d, and 910e of home controller 902 can be fastened to a respective portion (e.g., a tab with a through-hole) of conductive liner 904 to securely mount home controller 902 to an interior wall of inverter device 900.

Figure 10:
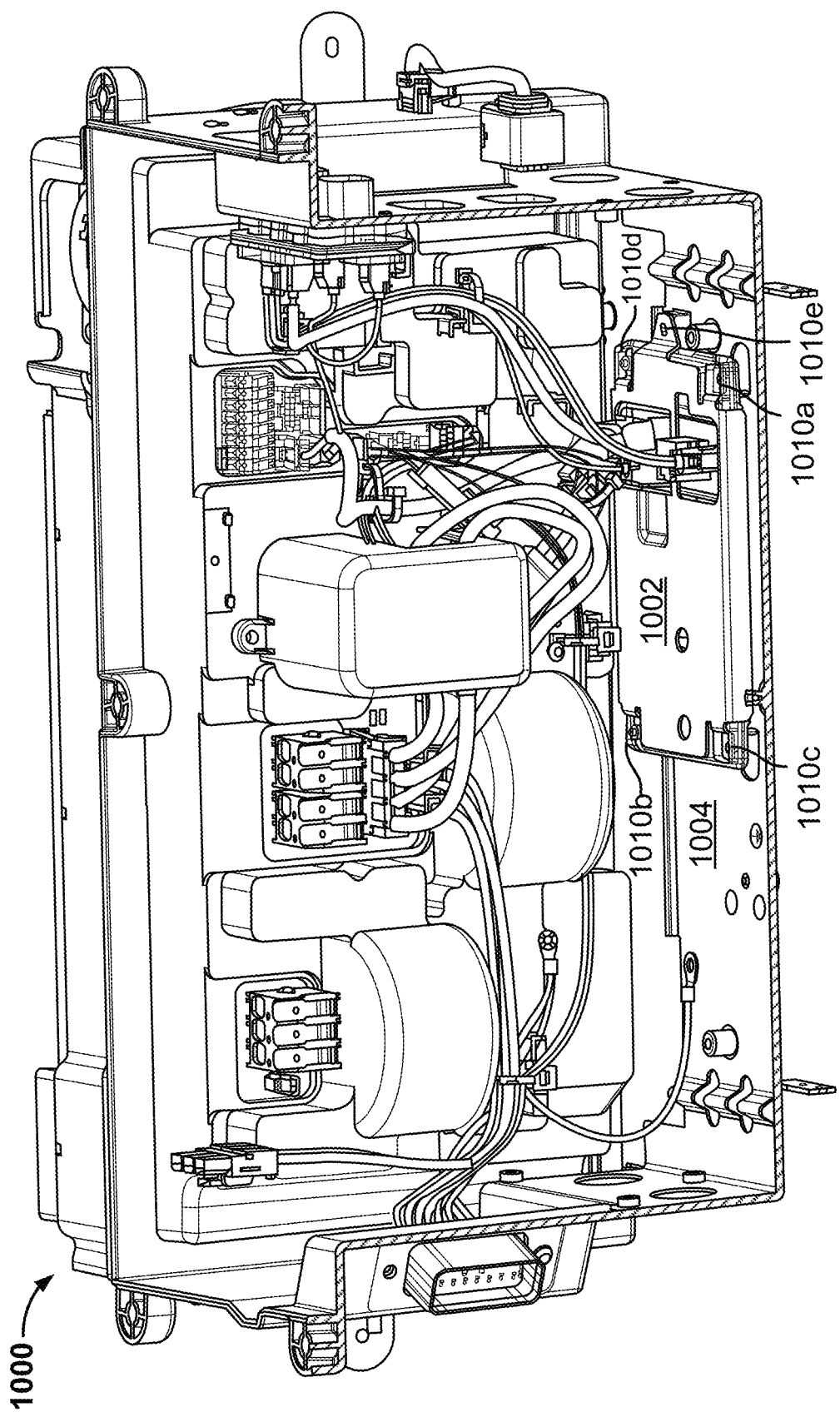
FIG. 10 is a diagram showing the interior of an inverter device in accordance with some embodiments

FIG. 10 is a diagram showing the interior of an inverter device in accordance with some embodiments. As shown in FIG. 10, each of mounting points 1010a, 1010b, 1010c, 1010d, and 1010e of home controller 1002 can be fastened to a respective portion (e.g., a tab with a through-hole) of conductive liner 1004 to securely mount home controller 1002 to an interior wall of inverter device 1000. FIG. 10 further shows that the communication interfaces that are exposed out of the overmolded layer and the top surface conductive layer of home controller 1002 are connected via cables to other modules within the interior of inverter device.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   an overmolded layer that is placed above a top surface and below a bottom surface of a circuit board, wherein the overmolded layer exposes at least communication interfaces on the circuit board and surrounds a heat generating component on the circuit board, wherein the overmolded layer further exposes a first set of mounting points on the circuit board, and wherein the system is operable to be mounted to an interior of an inverter device via the first set of mounting points;
   a conductive layer that is placed over the overmolded layer on the top surface of the circuit board, wherein the conductive layer exposes the communication interfaces of the circuit board and covers the heat generating component on the circuit board, wherein the conductive layer comprises through-holes corresponding to the first set of mounting points on the circuit board, wherein the conductive layer is operable to be fastened to the circuit board via the first set of mounting points; and
   wherein heat from the heat generating component is transferred into the conductive layer.

2. The system of claim 1, wherein the overmolded layer surrounds a perimeter of the heat generating component on the circuit board.

3. The system of claim 1, wherein the conductive layer comprises a metallic sheet.

4. The system of claim 1, wherein the conductive layer comprises a recessed area that covers the heat generating component.

5. The system of claim 4, wherein a thermal interface pad is attached on a top surface of the heat generating component and wherein the thermal interface pad is substantially flush with a bottom surface of the recessed area.

6. The system of claim 5, wherein the thermal interface pad is compressible.

7. The system of claim 1, wherein the heat generating component is a central processing unit.

8. The system of claim 1, wherein the first set of mounting points is fastened to a conductive liner along a side of an insulating enclosure of the inverter device.

9. The system of claim 8, wherein the conductive liner provides grounding.

10. The system of claim 1, wherein the conductive layer further includes a second set of mounting points, and wherein the system is operable to be mounted to the interior of the inverter device via the first set of mounting points and the second set of mounting points.

11. The system of claim 1, wherein the conductive layer exposes the communication interfaces of the circuit board via a plurality of apertures.

12. The system of claim 1, wherein the overmolded layer comprises a ridge that is exposed through a cutout region of the conductive layer.

13. The system of claim 1, wherein the overmolded layer is added to the circuit board via low pressure injection molding.

* * * * *